United States Patent
McCann

(10) Patent No.: US 6,838,309 B1
(45) Date of Patent: Jan. 4, 2005

(54) FLIP-CHIP MICROMACHINE PACKAGE USING SEAL LAYER

(75) Inventor: David McCann, Chandler, AZ (US)

(73) Assignee: Amkor Technology, Inc., Chadler, AZ (US)

( * ) Notice: Subject to any disclaimer, the term of this patent is extended or adjusted under 35 U.S.C. 154(b) by 135 days.

(21) Appl. No.: 10/097,905

(22) Filed: Mar. 13, 2002

(51) Int. Cl.[7] .............................................. H01L 21/50
(52) U.S. Cl. ....................................................... 438/106
(58) Field of Search ................................ 438/106, 107, 438/118, 124, 127, 30, 113, 125, 50, 612, 53, 51, 52, 110; 435/287.2; 257/620

(56) References Cited

U.S. PATENT DOCUMENTS

| | | | |
|---|---|---|---|
| 5,583,376 A | 12/1996 | Sickler et al. | 257/702 |
| 5,610,431 A | 3/1997 | Martin | 257/415 |
| 5,719,069 A | 2/1998 | Sparks | 437/59 |
| 5,898,220 A | 4/1999 | Ball | 257/723 |
| 5,915,168 A | 6/1999 | Salatino et al. | 438/110 |
| 5,985,693 A | * 11/1999 | Leedy | 438/107 |
| 6,074,891 A | 6/2000 | Staller | 438/53 |
| 6,084,297 A | 7/2000 | Brooks et al. | 257/698 |
| 6,084,308 A | 7/2000 | Kelkar et al. | 257/777 |
| 6,165,820 A | * 12/2000 | Pace | 438/125 |
| 6,214,640 B1 | * 4/2001 | Fosberry et al. | 438/106 |
| 6,214,644 B1 | 4/2001 | Glenn | 438/108 |
| 6,258,626 B1 | 7/2001 | Wang et al. | 438/107 |
| 6,266,197 B1 | 7/2001 | Glenn et al. | 359/819 |

* cited by examiner

*Primary Examiner*—Michael Tokar
*Assistant Examiner*—Monica D. Harrison
(74) *Attorney, Agent, or Firm*—Gunnison, McKay & Hodgson, L.L.P.; Serge J. Hodgson

(57) ABSTRACT

A micromachine package includes a micromachine chip having a front surface and a micromachine area on the front surface. The micromachine package further includes a substrate having at least one vent extending through the substrate. A seal layer extends between the front surface of the micromachine chip and an upper surface of the substrate. The vent extends to the seal layer directly opposite of a cavity defined by an upper surface of the seal layer and the front surface of the micromachine chip. The micromachine area is located within the cavity.

20 Claims, 7 Drawing Sheets

US 6,838,309 B1

FLIP-CHIP MICROMACHINE PACKAGE USING SEAL LAYER

BACKGROUND OF THE INVENTION

1. Field of the Invention

The present invention relates generally to the packaging of electronic components. More particularly, the present invention relates to a micromachine package and method of fabricating the same.

2. Description of the Related Art

A micromachine chip, sometimes called a microelectronic mechanical machine or MEMS, included a micromachine sensing element. A micromachine sensing element (hereinafter a micromachine element) was well known. A micromachine element typically included a miniature moveable structure, such as a bridge, cantilevered beam, suspended mass, membrane or capacitive element, which was supported over a cavity formed in a silicon wafer. Since the operation of the micromachine element depended upon the moveability of the miniature moveable structure, it was critical that the micromachine package, which included the micromachine chip, did not contact the miniature moveable structure in any manner.

Often, the micromachine chip was packaged using a ceramic substrate. This ceramic substrate was formed with a cavity, and the micromachine chip was located within the cavity. The cavity including the micromachine chip was hermetically sealed with a ceramic lid.

Once the micromachine chip was hermetically sealed within the cavity, the micromachine chip was protected from the ambient environment, e.g., from particulates and moisture. However, ceramic substrates were relatively expensive thus the cost of the micromachine package was relatively high.

SUMMARY OF THE INVENTION

In accordance with one embodiment of the present invention, a micromachine package includes a micromachine chip having a front surface and a micromachine area on the front surface. The micromachine package further includes a substrate having at least one vent extending through the substrate.

A seal layer extends between the front surface of the micromachine chip and an upper surface of the substrate. The vent extends to the seal layer directly opposite of a cavity defined by an upper surface of the seal layer and the front surface of the micromachine chip. The micromachine area is located within the cavity.

In one embodiment, the seal layer forms a seal around the micromachine area to protect the micromachine area from the ambient environment. However, in the event that water is trapped between the substrate and the micromachine chip, e.g., in the cavity, the vent provides a channel through which the water can escape. Further, the vent provides a pressure relief channel to prevent pressure from building between the substrate and the micromachine chip.

In accordance with another embodiment of the present invention, a method of forming a micromachine package includes forming at least one vent in a substrate. Vacuum is applied to the vent. A seal layer is pressed on to the substrate and the vent while the vacuum is applied to shape the seal layer. A micromachine chip is mounted to the substrate with the seal layer. By shaping the seal layer, contact of a micromachine area of the micromachine chip with the seal layer is prevented.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1:
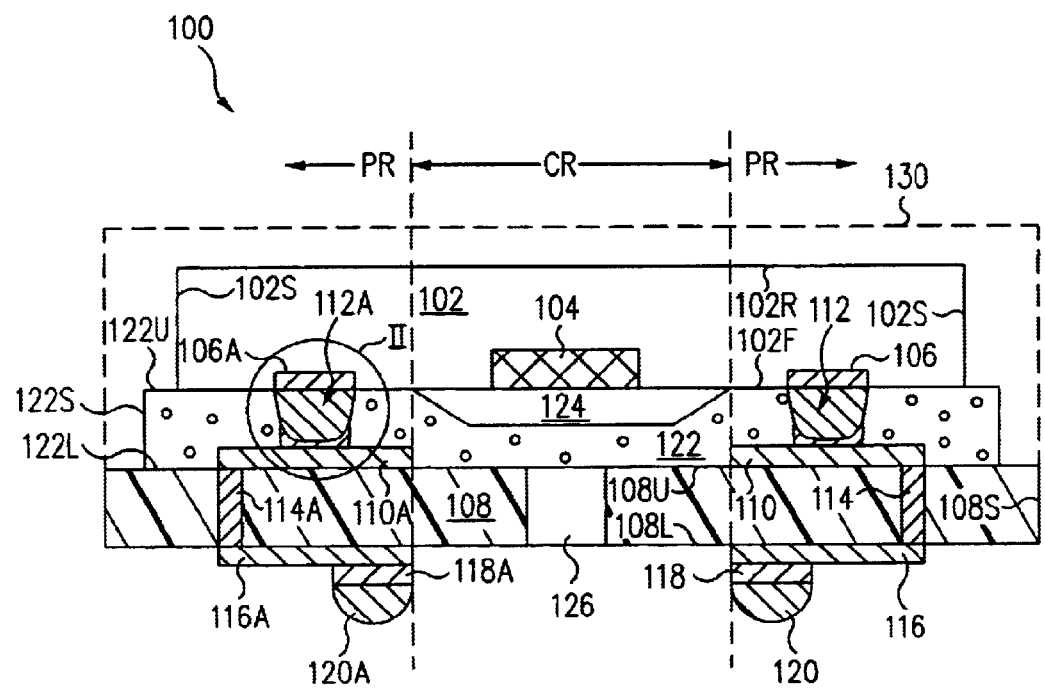
FIG. 1 is a cross-sectional view of a micromachine package in accordance with one embodiment of the present invention.

In accordance with one embodiment of the present invention, a micromachine package 100 (FIG. 1) includes a micromachine chip 102 having a front surface 102F and a micromachine area 104 on front surface 102F. Micromachine package 100 further includes a substrate 108 having at least one vent 126 extending through substrate 108.

A seal layer 122 extends between front surface 102F of micromachine chip 102 and an upper surface 108U of substrate 108. Vent 126 extends to seal layer 122 directly opposite of a cavity 124 defined by an upper surface 122U of seal layer 122 and front surface 102F of micromachine chip 102. Micromachine area 104 is located within cavity 124.

In one embodiment, seal layer 122 forms a seal around micromachine area 104 to protect micromachine area 104 from the ambient environment. However, in the event that water is trapped in cavity 124, vent 126 provides a channel through which the water can escape. Further, vent 126 provides a pressure relief channel to prevent pressure from building between substrate 108 and micromachine chip 102.

More particularly, FIG. 1 is a cross-sectional view of a micromachine package 100 in accordance with one embodiment of the present invention. Referring to FIG. 1, micromachine package 100 includes a micromachine chip 102 having a front, e.g., first, surface 102F and a rear, e.g., second, surface 102R. A micromachine area 104, sometimes called an active area, is formed on front surface 102F and contains a micromachine element. A micromachine element is a miniature moveable structure, such as a bridge, cantilevered beam, suspended mass, membrane or capacitive element, which is supported over a cavity as is well known to those of skill in the art.

Micromachine chip 102 further includes a plurality of bond pads 106 on front surface 102F of micromachine chip 102. In this embodiment, bond pads 106 are directly adjacent to at least two of the plurality of sides 102S of micromachine chip 102, preferably opposite one another. Bond pads 106 are connected to the internal circuitry of micromachine chip 102.

Micromachine chip 102 is mounted to a substrate 108. Illustratively, substrate 108 is ceramic, printed circuit board, laminate, liquid crystal polymer and/or tape although other materials are used in other embodiments.

In one embodiment, substrate 108 is a low cost laminate substrate. By using a low cost laminate substrate 108 to form micromachine package 100, micromachine package 100 is formed at a significantly lower cost than a micromachine package formed with a ceramic substrate.

Formed on an upper, e.g., first, surface 108U of substrate 108 are a plurality of electrically conductive traces 110. Bond pads 106 are electrically connected to corresponding traces 110 by corresponding electrically conductive columns 112.

Traces 110 are electrically connected to corresponding electrically conductive vias 114, which extend from upper surface 108U to a lower, e.g., second, surface 108L of substrate 108. Vias 114 are electrically connected to corresponding electrically conductive traces 116 on lower surface 108L of substrate 108. Formed on traces 116 are corresponding electrically conductive pads 118. Formed on pads 118 are corresponding electrically conductive interconnection balls 120 such as solder balls. Interconnection balls 120 are used to electrically connect micromac thine package 100 to a larger substrate (not shown) such as a printed circuit mother board.

To illustrate, a first bond pad 106A of the plurality of bond pads 106 is electrically connected to a first trace 110A of the plurality of traces 110 by a first column 112A of the plurality of columns 112. Trace 110A is electrically connected to a first via 114A of the plurality of vias 114. Via 114A is electrically connected to a first trace 116A of the plurality of traces 116. A first pad 118A of the plurality of pads 118 is formed on trace 116A. Formed on pad 118A is a first interconnection ball 120A of the plurality of interconnection balls 120.

As set forth above, an electrically conductive pathway between bond pad 106A and interconnection ball 120A is formed by column 112A, trace 110A, via 114A, trace 116A and pad 118A. The other bond pads 106, columns 112, traces 110, vias 114, traces 116, pads 118 and interconnection balls 120 are electrically connected to one another in a similar fashion and so are not discussed further to avoid detracting from the principals of the invention.

Although a particular electrically conductive pathway between bond pad 106A and interconnection ball 120A is described above, in light of this disclosure, it is understood that other electrically conductive pathways can be formed. For example, substrate 108 is a multi-layered laminate substrate and, instead of straight-through vias 114, a plurality of electrically conductive traces on various layers in substrate 108 are interconnected by a plurality of electrically conductive vias to form the electrical interconnections between traces 110 and 116.

As a further example, vias 114 extend along sides 108S of substrate 108 and traces 110 and 116 extend to sides 108S. As another alternative, interconnection balls 120 are distributed in an array format to form a ball grid array (BGA) package. Alternatively, interconnection balls 120 (or pads 118 and interconnection balls 120) are not formed, e.g., to form a metal land grid array (LGA) package or a leadless chip carrier (LCC) package. As a further alternative, upper surface 108U and/or lower surface 108L of substrate 108 include a solder mask(s) in a conventional manner.

Further, in one embodiment, pads 118 are not formed such that interconnection balls 120 are formed directly on traces 116. As a further alternative, contact metallizations (not shown) are interposed between various electrical conductors of micromachine package 100, e.g., between columns 112 and traces 110. Other electrically conductive pathway modifications will be obvious to those of skill in the art.

Extending between and mounted to both micromachine chip 102 and substrate 108 is a seal layer 122. Although seal layer 122 is illustrated as being a single layer, in an alternative embodiment, seal layer 122 includes more than one layer. For example, seal layer 122 includes a semipermeable layer having adhesive layer(s) on one or both surfaces.

More particularly, seal layer 122 includes a lower, e.g., first, surface 122L mounted to upper surface 108U of substrate 108. Seal layer 122 further includes an upper, e.g., second, surface 122U mounted to a peripheral region PR of front surface 102F of micromachine chip 102.

In one embodiment, peripheral region PR of front surface 102F of micromachine chip 102 is directly adjacent sides 102S of micromachine chip 102. Sides 102S extend between and are perpendicular to front surface 102F and rear surface 102R of micromachine chip 102, which are parallel to one another. Further, bond pads 106 are on peripheral region PR of front surface 102F of micromachine chip 102.

Micromachine area 104 is formed on a central region CR of front surface 102F of micromachine chip 102. Peripheral region PR is around and surrounds central region CR.

Seal layer 122 does not contact and is spaced apart from central region CR and thus micromachine area 104. More particular, a distance exists between upper surface 122U of seal layer 122 and micromachine area 104 to allow free movement of the micromachine element(s) of micromachine area 104.

Seal layer 122 and central region CR of front surface 102F of micromachine chip 102 define a cavity 124. More particular, cavity 124 is defined by a central region CR of upper surface 122U of seal layer 122 and central region CR of front surface 102F of micromachine chip 102. Micromachine area 104 is located within cavity 124.

Seal layer 122 forms a seal between peripheral region PR of front surface 102F of micromachine chip 102 and upper surface 108U of substrate 108. More particular, a peripheral region PR of upper surface 122U of seal layer 122 is mounted to and contacts peripheral region PR of front surface 102F of micromachine chip 102. Further, lower surface 122L of seal layer 122 is mounted to and contacts upper surface 108U of substrate 108.

In one embodiment, peripheral region PR of upper surface 122U of seal layer 122 is adjacent sides 122S of seal layer 122. Sides 122S extend between upper surface 122U and lower surface 122L of seal layer 122.

As shown in FIG. 1, seal layer 122 has an area in a plane parallel to front surface 102F of micromachine chip 102 greater than an area of front surface 102F of micromachine chip 102. Accordingly, sides 122S of seal layer 122 are further outwards then sides 102S of micromachine chip 102. However, in alternative embodiments, seal layer 122 has an area in a plane parallel to front surface 102F of micromachine chip 102 less than or equal to the area of front surface 102F of micromachine chip 102.

By forming a seal around micromachine area 104 with seal layer 122 as discussed above, micromachine area 104 is protected from the ambient environment. More particularly, micromachine area 104 is protected from particulates, e.g., dust, and moisture. To further protect micromachine area 104, in one embodiment, micromachine chip 102 and seal layer 122 are encapsulated within a molding 130, as indicated by the dashed line.

In one embodiment, substrate 108 is formed with a vent 126. Vent 126 is an aperture, sometimes called a vent hole or pressure relief channel. Vent 126 extends through a central region CR of substrate 108 from upper surface 108U to lower surface 108L. Although a single vent 126 is illustrated in FIG. 1, generally, at least one vent 126 is formed, e.g., two or more vents 126 are formed.

Vent 126 extends to and is located on lower surface 122L of seal layer 122 directly opposite of cavity 124. In the event that water is trapped between substrate 108 and micromachine chip 102, e.g., in cavity 124, vent 126 provides a channel through which the water can escape. To facilitate this escape of water, in one embodiment, seal layer 122 is semi-permeable to water. Thus, in the event that water is trapped between substrate 108 and micromachine chip 102, micromachine package 100 is simply heated to drive the water out of micromachine package 100 through vent 126.

Further, vent 126 prevents pressure from building between substrate 108 and micromachine chip 102. For example, in the event that micromachine package 100 becomes heated, e.g., during reflow of interconnection balls 120, pressure buildup by expansion of air or water within cavity 124 is vented through vent 126. This minimizes the possibility of failure of micromachine package 100.

Although water and air pass through seal layer 122, particulates do not to pass through seal layer 122, i.e., seal layer 122 is impenetrable to particulates. In this manner, seal layer 122 prevents contamination of micromachine area 104 with particulates.

Figure 2A:
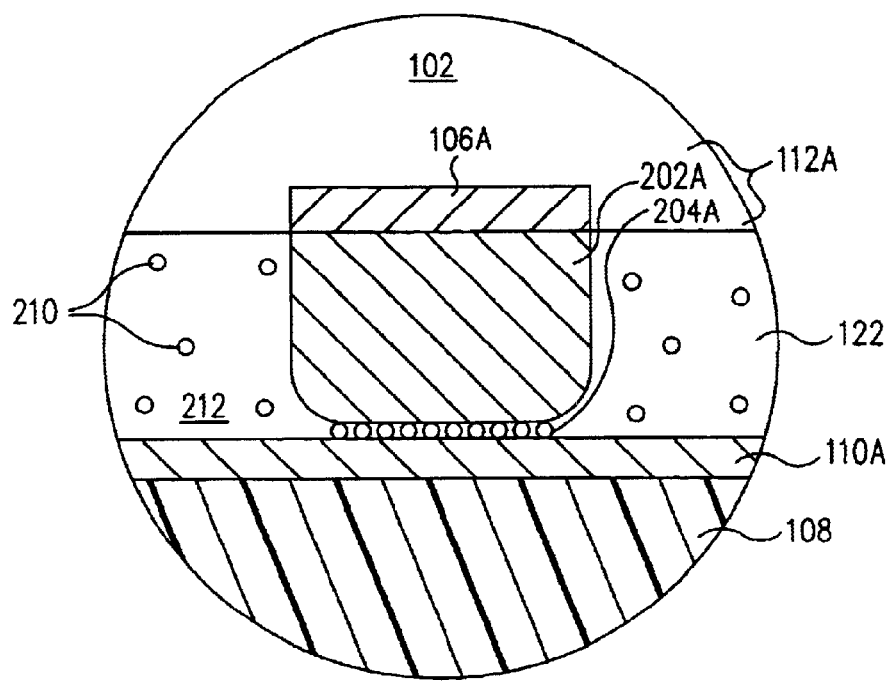
FIGS. 2A and 2B are enlarged cross-sectional views of the region II of the micromachine package of FIG. 1 in accordance with various embodiments of the present invention.

As discussed above, bond pads 106 are electrically connected to traces 110 by columns 112. FIG. 2A is an enlarged cross-sectional view of the region II including column 112A of micromachine package 100 of FIG. 1 in accordance with one embodiment of the present invention.

Referring now to FIG. 2A, column 112A includes an electrically conductive bump 202A and an electrically conductive plug 204A. For example, bump 202A is a gold bump, sometimes called a stud bump, although bump 202A is formed of other electrically conductive materials in other embodiments.

In accordance with one embodiment, seal layer 122 is a dielectric material, which becomes electrically conductive when sufficiently compressed. For example, seal layer 122 is an anisotropic conductive film, sometimes called ACF. In accordance with this embodiment, plug 204A is a region of seal layer 122, which has been compressed between bump 202A and trace 110A sufficiently to become electrically conductive. Thus, plug 204A is sometimes called a compressed region of seal layer 122.

To illustrate, seal layer 122 includes electrically conductive particles 210 suspended in a dielectric matrix 212, e.g., a dry polymer film. When seal layer 122 is uncompressed or only slightly compressed, particles 210 are electrically isolated from one another by dielectric matrix 212. Accordingly, when uncompressed, seal layer 122 is a dielectric.

In contrast, seal layer 122 is compressed between bump 202A and trace 110A. Thus, within plug 204A, particles 210 contact one another or contact both bump 202A and trace 110A forming an electrically conductive pathway through seal layer 122 between bump 202A and trace 110A.

Further, seal layer 122 is squeezed away from between bump 202A and trace 110A, i.e., away from plug 204A, to enhance the seal between front surface 102F of micromachine chip 102 and upper surface 108U of substrate 108. Stated another way, seal layer 122 is pushed away from between bump 202A and trace 110A, i.e., away from column 112A, to fill any gaps between front surface 102F of micromachine chip 102 and upper surface 108U of substrate 108. The other columns 112 are formed of bumps 202 and plugs 204 in a similar manner and so are not discussed further to avoid detracting from the principals of the invention.

As discussed above, columns 112 include electrically conductive compressed regions of seal layer 122. However, in alternative embodiments, seal layer 122 is a dielectric and columns 112 are separate structures passing through seal layer 122.

Figure 2B:
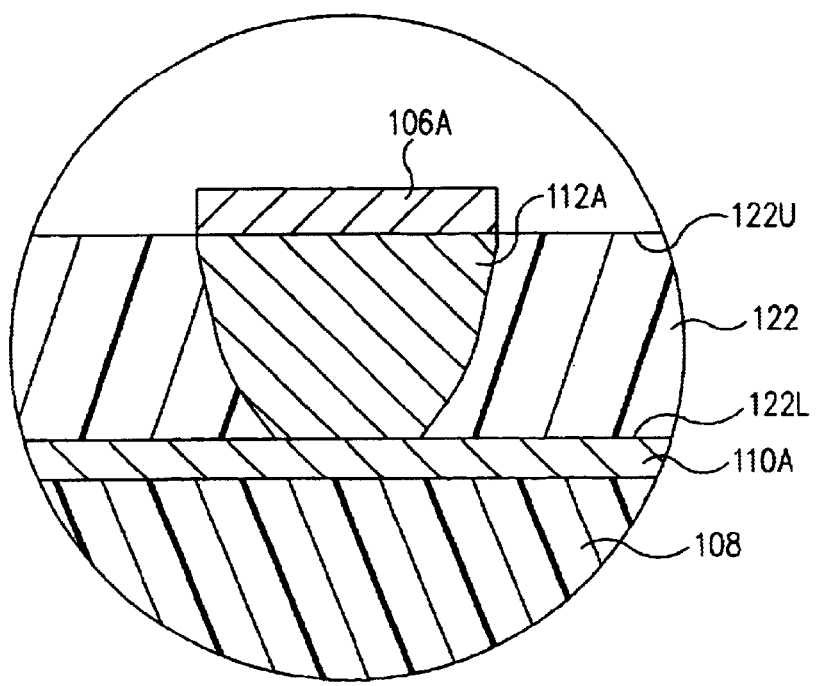

FIG. 2B is an enlarged cross-sectional view of the region II including column 112A of micromachine package 100 of FIG. 1 in accordance with another embodiment of the present invention. In accordance with this embodiment, seal layer 122 is a dielectric.

Column 112A penetrates and passes through seal layer 122 from bond pad 106A to trace 110A. For example, column 112A is an electrically conductive bump such as gold bump that is formed on bond pad 106A with a tail or other penetrating tip. During mounting of micromachihe chip 102 to substrate 108 as discussed further below, this electrically conductive bump penetrates through seal layer 122 from upper surface 122U to lower surface 122L and to trace 110A.

Referring again to FIG. 1, seal layer 122 has a thickness sufficient to form a seal between peripheral region PR of front surface 102F of micromachine chip 102 and upper surface 108U of substrate 108. However, to prevent seal layer 122 from contacting micromachine area 104, in one embodiment, the spacing between peripheral region PR of front surface 102F of micromachine chip 102 and upper surface 108U of substrate 108 is less than the spacing between central region CR of front surface 102F of micromachine chip 102 and upper surface 108U of substrate 108.

Figure 3:
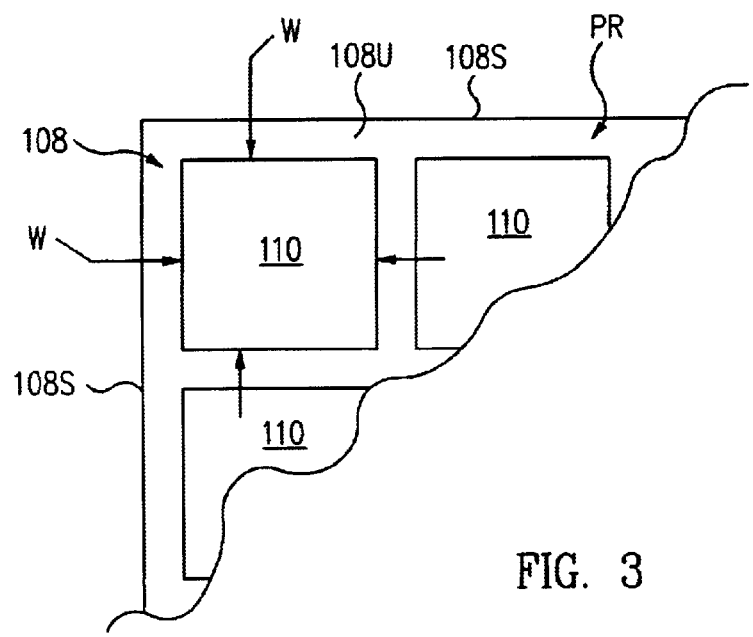
FIG. 3 is a partial top plan view of a substrate of FIG. 1 having extended width traces in accordance with one embodiment of the present invention.

FIG. 3 is a partial top plan view of substrate 108 of FIG. 1 having extended width traces 110 in accordance with one embodiment of the present invention. In accordance with this embodiment, traces 110 form a spacer layer on upper surface 108U of substrate 108.

More particularly, traces 110 are formed with an extra large width W such that traces 110 form an annular spacer layer on a peripheral region PR of upper surface 108U adjacent sides 108S of substrate 108. Stated another way, by forming traces 110 with an extra large width W, traces 110 occupy essentially the entire peripheral region PR of upper surface 108U of substrate 108. Of course, a small spacing should be provided between traces 110 to prevent traces 110 from shorting to one another.

Referring now to FIGS. 1 and 3 together, by using extended width traces 110 as a spacer layer, seal layer 122 extends and is compressed between traces 110 and peripheral region PR of front surface 102F of micromachine chip 102. Thus, in accordance with this embodiment, seal layer 122 forms a seal between traces 110 and peripheral region PR of front surface 102F of micromachine chip 102.

The distance between traces 110 and peripheral region PR of front surface 102F of micromachine chip 102 is less than the distance between upper surface 108U of substrate 108 and central region CR of front surface 102F of micromachine chip 102. As a result, seal layer 122 does not contact micromachine area 104.

Figure 4:
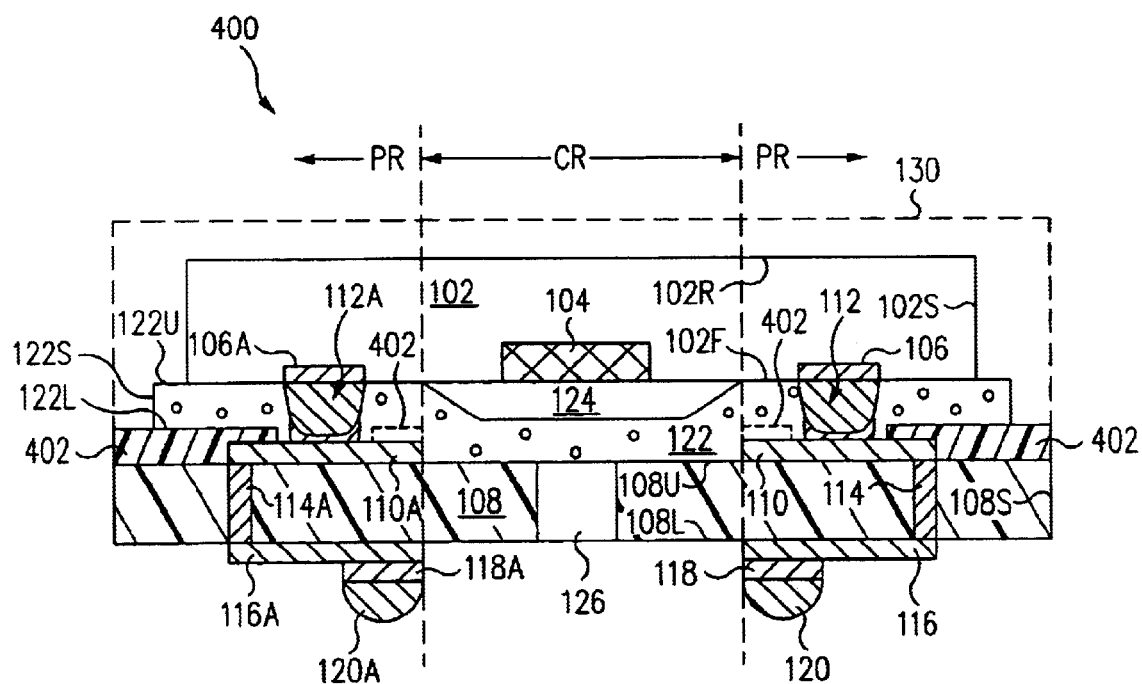
FIG. 4 is a cross-sectional view of a micromachine package having a substrate formed with a substrate spacer layer in accordance with another embodiment of the present invention.
Figure 5:
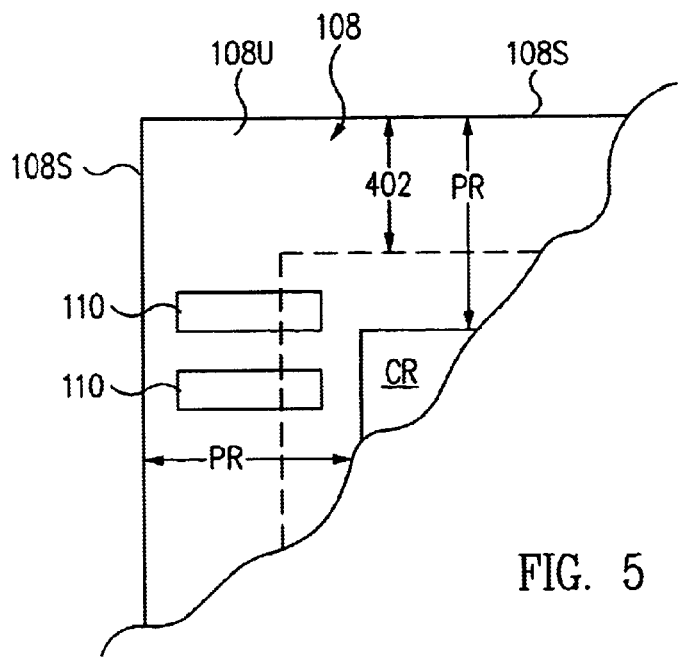
FIG. 5 is a partial top plan view of the substrate including the substrate spacer layer of FIG. 4 in accordance with one embodiment of the present invention.

FIG. 4 is a cross-sectional view of a micromachine package 400 having a substrate 108 formed with a substrate spacer layer 402 in accordance with one embodiment of the present invention. FIG. 5 is a partial top plan view of substrate 108 including substrate spacer layer 402 of FIG. 4 in accordance with one embodiment of the present invention. Micromachine package 400 of FIGS. 4 and 5 is similar to micromachine package 100 of FIG. 1 and only the significant differences are discussed below.

Referring now to FIGS. 4 and 5 together, formed on peripheral region PR of upper surface 108U of substrate 108 is substrate spacer layer 402. Substrate spacer layer 402 is formed of any one of a number of materials, for example, solder mask, epoxy or electrically isolated metal.

As best shown in FIG. 5, substrate spacer layer 402 is an annular ring directly adjacent sides 108S of substrate 108. Seal layer 122 extends and is compressed between substrate spacer layer 402 and peripheral region PR of front surface 102F of micromachine chip 102. Thus, in accordance with this embodiment, seal layer 122 forms a seal between substrate spacer layer 402 and peripheral region PR of front surface 102F of micromachine chip 102.

The distance between substrate spacer layer 402 and peripheral region PR of front surface 102F of micromachine chip 102 is less than the distance between upper surface 108U of substrate 108 and central region CR of front surface 102F of micromachine chip 102. As a result, the possibility of seal layer 122 contacting micromachine area 104 is minimized.

Although substrate spacer layer 402 is illustrated in FIGS. 4 and 5 as being directly adjacent sides 108S of substrate 108, in one embodiment, substrate spacer layer 402 is formed on upper surface 108U of substrate 108 to be directly opposite of at least some or all of peripheral region PR of front surface 102F of micromachine chip 102. More particularly, substrate spacer layer 402 is formed to contact lower surface 122L of seal layer 122 directly opposite of where peripheral region PR of front surface 102F of micromachine chip 102 contacts upper surface 122U of seal layer 122. This insures that seal layer 122 is compressed between substrate spacer layer 402 and peripheral region PR of front surface 102F of micromachine chip 102.

As discussed above, substrate spacer layer 402 is formed outwards of columns 112 directly adjacent side 108S of substrate 108. Alternatively, or in addition, substrate spacer layer 402 is formed inwards directly adjacent central region CR of upper surface 108U of substrate 108 and/or around columns 112 as indicated by the dashed lines in FIG. 4.

Figure 6:
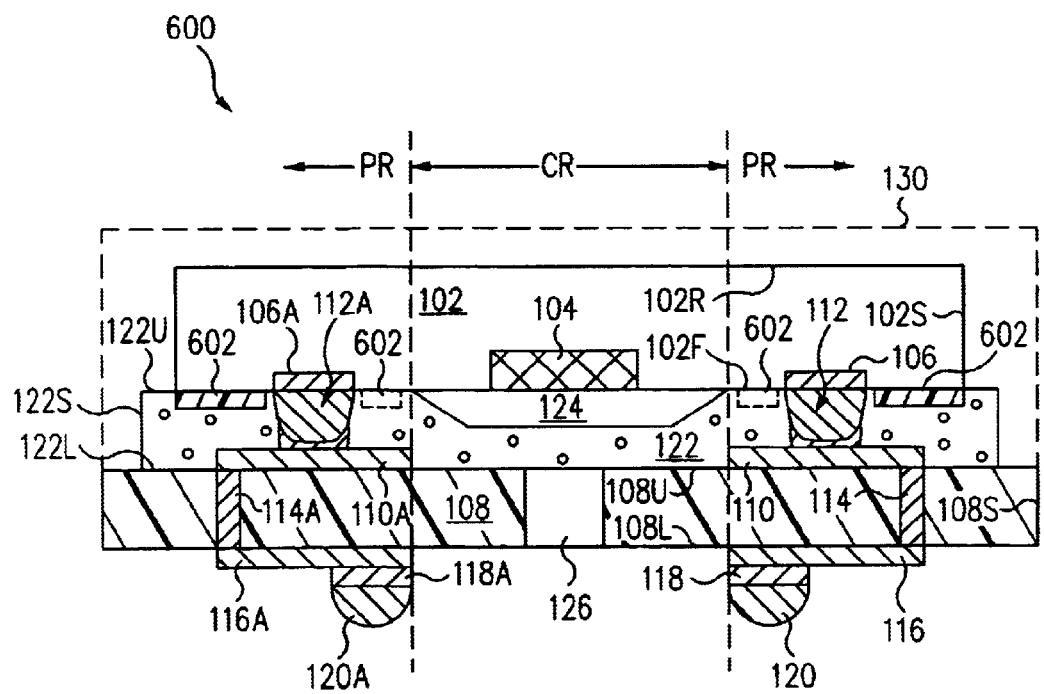
FIG. 6 is a cross-sectional view of a micromachine package having a micromachine chip formed with a micromachine spacer layer in accordance with another embodiment of the present invention.

FIG. 6 is a cross-sectional view of a micromachine package 600 having a micromachine chip 102 formed with a micromachine spacer layer 602 in accordance with one embodiment of the present invention. Micromachine package 600 of FIG. 6 is similar to micromachine package 100 of FIG. 1 and only the significant differences are discussed below.

Referring now to FIG. 6, formed on peripheral region PR of front surface 102F of micromachine chip 102 is micromachine spacer layer 602. Micromachine spacer layer 602 is formed of any one of a number of materials, for example, solder mask, a passivation layer such a silicon oxide or silicon nitride, epoxy or electrically isolated metal. The particular material used and method of forming micromachine spacer layer 602 is not essential to the present invention.

Micromachine spacer layer 602 is an annular ring directly adjacent sides 102S of micromachine chip 102. Although micromachine spacer layer 602 is illustrated in FIG. 6 as being directly adjacent sides 102S of micromachine chip 102, in an alternative embodiment, a small space exists on front surface 102F between sides 102S and micromachine spacer layer 602. Stated another way, instead of being directly adjacent sides 102S, in an alternative embodiment, micromachine spacer layer 602 is formed inwards and spaced apart from sides 102S.

Seal layer 122 extends and is compressed between micromachine spacer layer 602 and upper surface 108U of substrate 108. Thus, in accordance with this embodiment, seal layer 122 forms a seal between micromachine spacer layer 602 and upper surface 108U of substrate 108.

The distance between micromachine spacer layer 602 and upper surface 108U of substrate 108 is less than the distance between upper surface 108U of substrate 108 and central region CR of front surface 102F of micromachine chip 102. As a result, seal layer 122 does not contact micromachine area 104.

Although micromachine spacer layer 602 is illustrated in FIG. 6 as being directly adjacent sides 102S of micromachine chip 102, in one embodiment, micromachine spacer layer 602 is formed to be on at least some or all of peripheral region PR of front surface 102F of micromachine chip 102.

For example, micromachine spacer layer 602 is formed outwards of bond pads 106 directly adjacent side 102S of micromachine chip 102 as discussed above. Alternatively, or in addition, micromachine spacer layer 602 is formed inwards of bond pads 106 and directly adjacent central region CR of front surface 102F of micromachine chip 102 and/or around bond pads 106 as indicated by the dashed lines in FIG. 6.

Figure 7:
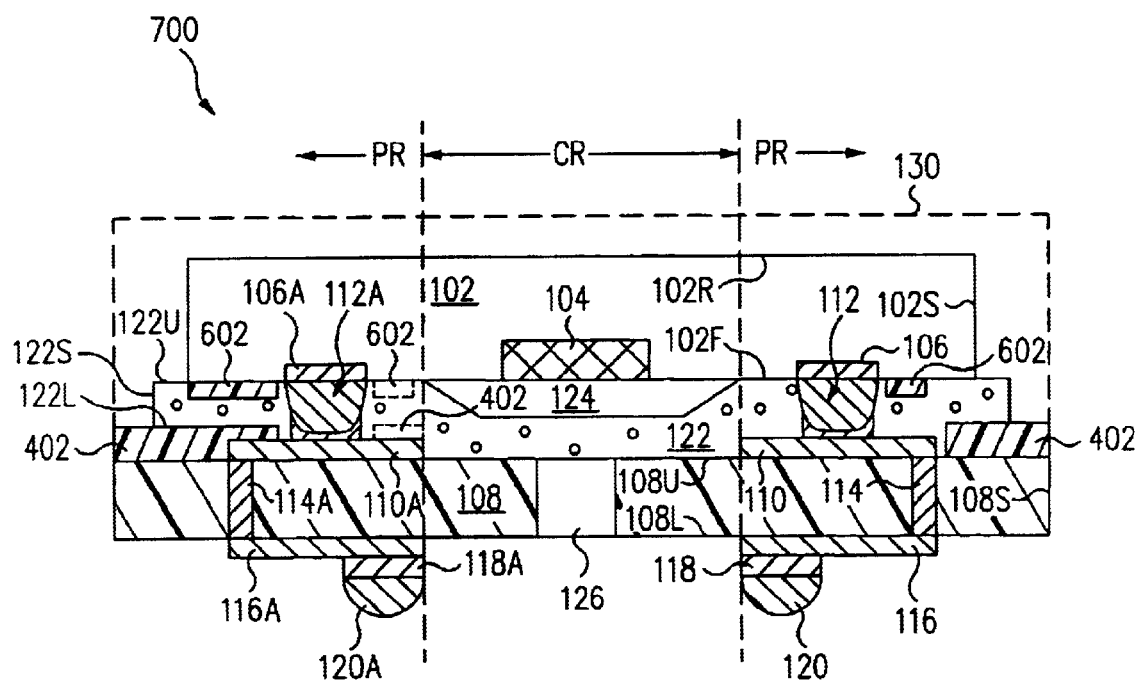
FIG. 7 is a cross-sectional view of a micromachine package having a substrate formed with a substrate spacer layer and a micromachine chip formed with a micromachine spacer layer in accordance with yet another embodiment of the present invention.

FIG. 7 is a cross-sectional view of a micromachine package 700 having a substrate 108 formed with a substrate spacer layer 402 and a micromachine chip 102 formed with a micromachine spacer layer 602 in accordance with another embodiment of the present invention. Micromachine package 700 of FIG. 7 is similar to micromachine package 100 of FIG. 1 and only the significant differences are discussed below.

Substrate spacer layer 402 and micromachine spacer layer 602 are formed on upper surface 108U of substrate 108 and on front surface 102F of micromachine chip 102 as discussed above in reference to FIGS. 4, 5, and FIG. 6, respectively.

In accordance with one embodiment, as shown on the left side of FIG. 7, substrate spacer layer 402 and micromachine spacer layer 602 are formed directly opposite one another. Accordingly, seal layer 122 extends and is compressed between substrate spacer layer 402 and micromachine spacer layer 602. Thus, seal layer 122 forms a seal between substrate spacer layer 402 and micromachine spacer layer 602.

The distance between substrate spacer layer 402 and micromachine spacer layer 602 is less than the distance between upper surface 108U of substrate 108 and central region CR of front surface 102F of micromachine chip 102. As a result, seal layer 122 does not contact micromachine area 104.

In accordance with an alternative embodiment, as shown on the right side of FIG. 7, substrate spacer layer 402 and micromachine spacer layer 602 are formed offset one another. In accordance with this embodiment, substrate spacer layer 402 and micromachine spacer layer 602 are not directly opposite one another but are laterally adjacent one another.

Accordingly, seal layer 122 extends and is compressed between substrate spacer layer 402 and peripheral region PR of front surface 102F of micromachine chip 102. Further, seal layer 122 extends and is compressed between micromachine spacer layer 602 and upper surface 108U of substrate 108. Thus, seal layer 122 forms a seal between substrate spacer layer 402 and peripheral region PR of front surface 102F of micromachine chip 102 and also between micromachine spacer layer 602 and upper surface 108U of substrate 108.

Although substrate spacer layer 402 and micromachine spacer layer 602 are shown on the left side of FIG. 7 as being directly opposite one another and on the right side of FIG. 7 as being offset from one another for purposes of discussion, it is understood that substrate spacer layer 402 and micromachine spacer layer 602 are either opposite or offset from one another and typically not both.

Figure 8:
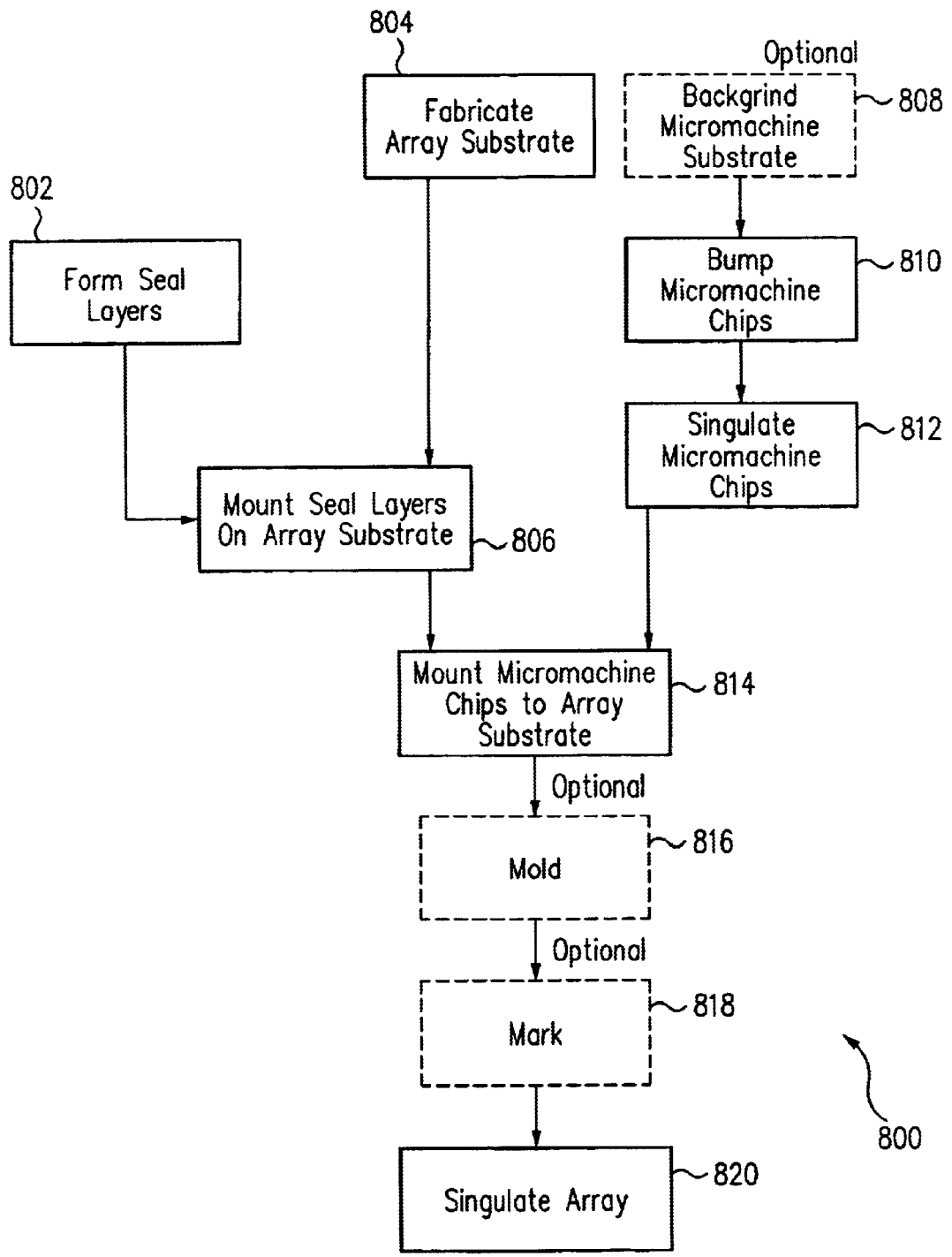
FIG. 8 is a flowchart of a method of fabricating a plurality of micromachine packages in accordance with one embodiment of the present invention.

Referring now to FIG. 8, in one embodiment, a micromachine package is fabricated simultaneously with a plurality of micromachine packages. FIG. 8 is a flowchart 800 of a method of fabricating a plurality of micromachine packages in accordance with one embodiment of the present invention.

Figure 9:
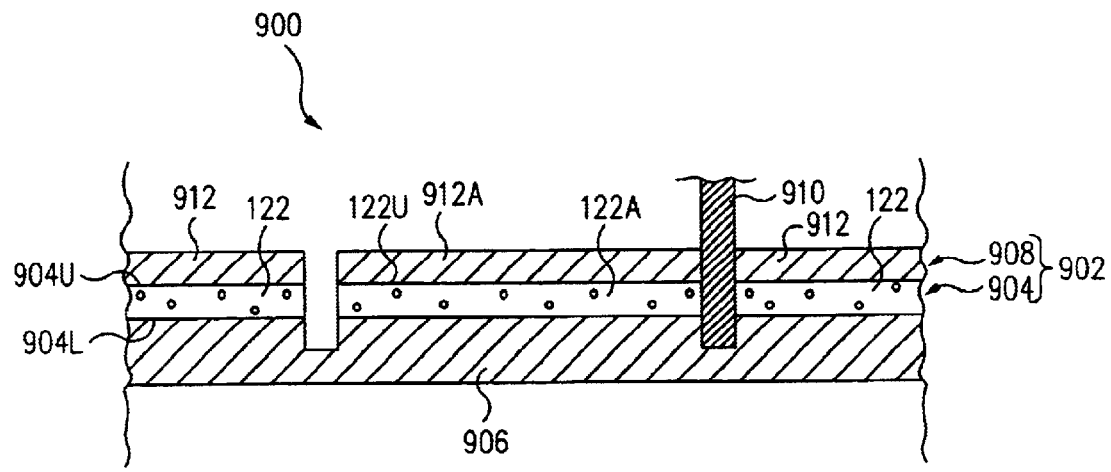
FIG. 9 is a cross-sectional view of an assembly during the formation of a plurality of seal layers from a seal layer sheet in accordance with one embodiment of the present invention.

FIG. 9 is a cross-sectional view of an assembly 900 during the formation of a plurality of seal layers 122 from a seal layer sheet 902 in accordance with one embodiment of the present invention. Referring now to FIGS. 8 and 9 together, in a form seal layers operation 802, seal layers 122 are formed from seal layer sheet 902.

Seal layer sheet 902 includes a seal layer film 904, hereinafter an ACF film 904, having a lower, e.g., first, surface 904L and an upper, e.g., second, surface 904U. Lower surface 904L is mounted to a singulation support 906, e.g., a blue sticky wafer sawing tape well known to those of skill in the art. Typically, a lower protective layer (not shown), sometimes called an ACF soft cover or film, is peeled from lower surface 904L of ACF film 904 to expose lower surface 904L prior to mounting to singulation support 906.

Seal layer sheet 902 further includes an upper protective layer 908 mounted to upper surface 904U of ACF film 904. Upper protective layer 908 is sometimes called an ACF hard cover or film.

Seal layer sheet 902 is cut, sometimes called singulated, with a sawblade 910 to form seal layers 122. Typically, sawblade 910 cuts through seal layer sheet 902 in a checkerboard fashion but only scores singulation support 906.

Although cutting with sawblade 910 is illustrated in FIG. 9, in alternative embodiments, seal layer sheet 902 is cut using other techniques, e.g., with a laser.

After singulation of seal layer sheet 902, seal layers 122, which include a first seal layer 122A, are the remaining portions of ACF film 904. Further, mounted to upper surfaces 122U of seal layers 122 are seal layer protective films 912. Seal layer protective films 912 are the remaining portions of upper protective layer 908.

To illustrate, after singulation of seal layer sheet 902, seal layer 122A is formed. Mounted to upper surface 122U of seal layer 122A is a first seal layer protective film 912A of the plurality of seal layer protective films 912. The other seal layer protective films 912 are mounted to the other seal layers 122 in a similar manner and so are not discussed further to avoid detracting from the principals of the invention.

Figure 10:
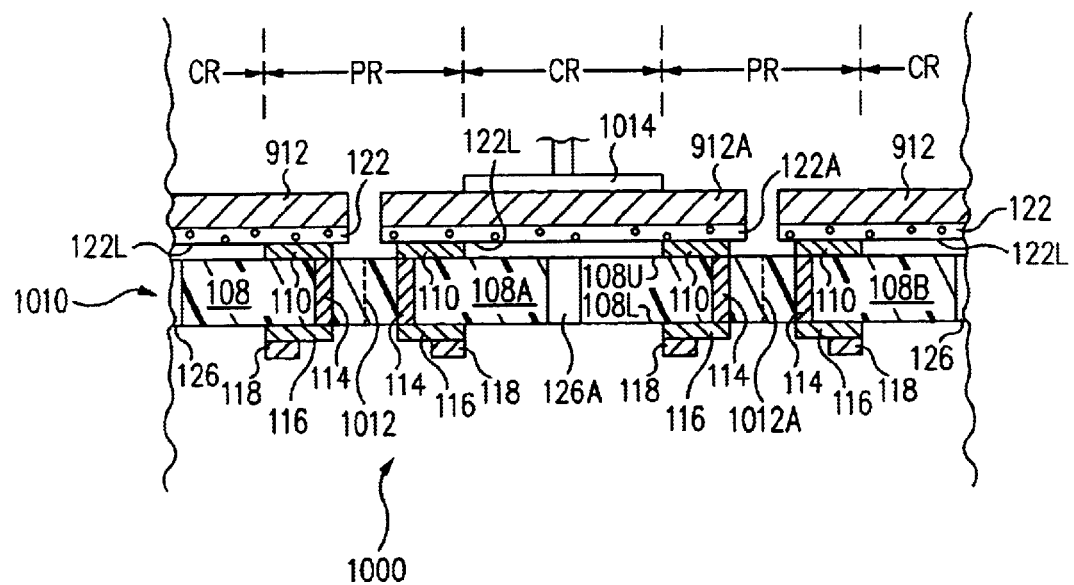
FIG. 10 is a cross-sectional view of an array of micromachine packages during assembly in accordance with one embodiment of the present invention.

Referring again to FIG. 8, in a fabricate array substrate operation 804, an array substrate 1010 (FIG. 10) is fabricated. FIG. 10 is a cross-sectional view of an array 1000 of micromachine packages 100 during assembly in accordance with one embodiment of the present invention.

Array 1000 includes array substrate 1010. Array substrate 1010 includes a plurality of individual substrates 108 integrally connected together in an array format, e.g., a 2×2, 3×3, ... nxm format.

Each of substrates 108 is delineated by a singulation street 1012, which is located between adjacent substrates 108. For example, a first singulation streets 1012A of the plurality of singulation streets 1012 delineates a first substrate 108A of the plurality of substrates 108 from a second substrate 108B of the plurality of substrates 108. The other substrates 108 are similarly delineated from adjacent substrates 108 by corresponding singulation streets 1012.

Substrates 108 include traces 110 on upper surfaces 108U of substrates 108. Substrates 108 also include vias 114 extending through substrates 108 and traces 116 on lower surfaces 108L of substrates 108. Pads 118 are on traces 116. In one embodiment, metallized vias along singulation streets 1012 are combined with conductive lands to provide LCC footprints.

Vents 126 are formed in substrates 108. Illustratively, vents 126 are formed by mechanical drilling, lasering, etching or punching. To illustrate, a first vent 126A of the plurality of vents 126 is formed in substrate 108A. The other vents 126 are formed in the other substrates 108 in a similar manner and so are not discussed further to avoid detracting from the principals of the invention.

From form seal layers operation 802 and fabricate array substrate operation 804 (FIG. 8), seal layers 122 are mounted on array substrate 1010 in a mount seal layers on array substrate operation 806.

Referring now to FIGS. 9 and 10 together, seal layers 122 having seal layer protective films 912 attached are removed from singulation support 906, e.g., manually with tweezers or with an automated pick and place machine. Seal layers 122 including seal layer protective films 912 are placed on substrates 108.

More particularly, lower surfaces 122L of seal layers 122 are placed on upper surfaces 108U of substrates 108 and on traces 110. To illustrate, lower surface 122L of seal layer 122A is placed on upper surface 108U of substrate 108A and on traces 110. The other seal layers 122 including seal layer protective films 912 are placed on the other substrates 108 and traces 110 in a similar manner and so are not discussed further to avoid detracting from the principals of the invention.

During or after placement of seal layers 122 on substrates 108, vacuum is applied to lower surfaces 108L of substrates 108. Accordingly, vacuum is applied to vents 126. This vacuum pulls central regions CR of seal layers 122 to upper surfaces 108U of substrates 108.

Heat and pressure are then applied to central regions CR of seal layers 122 to bond seal layers 122 to upper surfaces 108U of substrates 108. In this embodiment, the heat and pressure are applied by a thermode 1014. Thermodes are well known to those of skill in the art and so are only discussed briefly to avoid detracting from the principals of the invention.

More particularly, thermode 1014, which is heated, presses on seal layer protective films 912 and thus on seal layers 122 downwards towards substrates 108 and vents 126. At the same time, vacuum is applied to vents 126 as discussed above. Due to the combination of the vacuum applied to vents 126 and the pressure and heat from thermode 1014, seal layers 122 are bonded to upper surfaces 108U of substrates 108. Seal layer protective films 912 are then removed. Seal layers 122 are mounted to array substrate 1010 sequentially or simultaneously.

Figure 11:
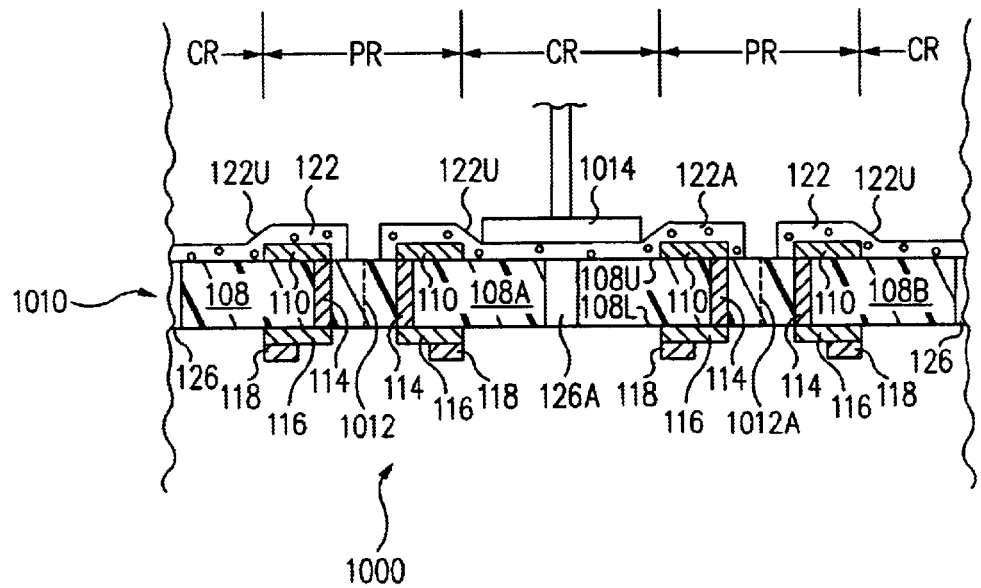
FIGS. 11 and 12 are cross-sectional views of the array of FIG. 10 at further stages during assembly in accordance with various embodiments of the present invention.

FIG. 11 is a cross-sectional view of array 1000 of FIG. 10 at a further stage during assembly in accordance with one embodiment of the present invention. Heat and pressure are again applied to central regions CR of seal layers 122 to shape seal layers 122. In this embodiment, the heat and pressure are again applied by thermode 1014.

More particularly, thermode 1014, which is heated, presses central regions CR of seal layers 122 downwards towards and on to substrates 108 and vents 126. At the same time, vacuum is applied to vents 126 as discussed above. Due to the combination of the vacuum applied to vents 126 and the pressure and heat from thermode 1014, seal layers 122 are shaped.

As shown in FIG. 11, seal layers 122 are shaped into the form of bowls. More particularly, a plane defined by peripheral regions PR of upper surfaces 122U of seal layers 122 is further away from a plane defined by upper surfaces 108U of substrates 108 than a plane defined by central regions CR of upper surfaces 122U of seal layers 122. As discussed further below, by shaping seal layers 122, seal layers 122 are prevented from contacting micromachine areas 104 of micromachine chips 102.

Referring again FIG. 8, optionally, in a backgrind micromachine substrate operation 808, a micromachine substrate, e.g., a wafer, is background to reduce the thickness of the micromachine substrate. Accordingly, the thickness of micromachine chips 102 (FIG. 12) of the micromachine substrate are also reduced.

From backgrind micromachine substrate operation 808, in a bump micromachine chips operation 810, bumps 202 (FIG. 12) are formed on bond pads 106 of micromachine chips 102 of the micromachine substrate. In one embodiment, to avoid damaging or destroying micromachine areas 104 of micromachine chips 102, bumps 202 are formed using a dry process. More particularly, wet etch processes are avoided. In one specific embodiment, bumps 202 are formed of gold using a stud bumping process. Illustratively, bumps 202 are formed using a wirebonding tool.

From bump micromachine chips operation 810, in a singulate micromachine chips operation 812, micromachine chips 102 are singulated from the micromachine substrate.

Figure 12:
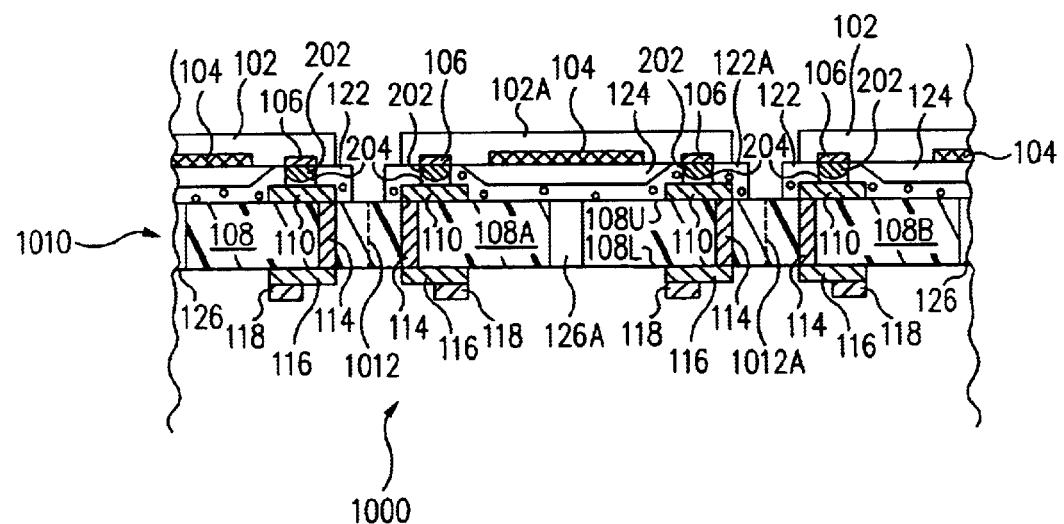

From mount seal layers on array substrate operation 806 and singulate micromachine chips operation 812, in a mount micromachine chips to array substrate operation 814, micromachine chips 102 are mounted to array substrate 1010. FIG. 12 is a cross-sectional view of array 1000 of FIG. 11 at a further stage during assembly in accordance with one embodiment of the present invention.

Referring now to FIGS. 8 and 12 together, in mount micromachine chips to array substrate operation 814, micromachine chips 102 are aligned with substrates 108, e.g., optically or mechanically. More particularly, bumps 202 are aligned with traces 110.

Micromachine chips 102 are then pressed towards substrates 108 and into seal layers 122. This causes regions of seal layers 122 between bumps 202 and traces 110 to become compressed and electrically conductive as discussed above. These electrically conductive compressed regions of seal layers 122 become electrically conductive plugs 204, which are also discussed above. Seal layers 122 are cured to mount micromachine chips 102 to substrates 108.

In one embodiment, micromachine chips 102 are pressed into seal layers 122 with a thermode, which is heated. The heat and pressure from the thermode cures seal layers 122. Thus, micromachine chips 102 are mounted to substrates 108 with seal layers 122.

To illustrate, a first micromachine chip 102A of the plurality of micromachine chips 102 is pressed towards substrate 108A and into seal layer 122A. This causes regions of seal layer 122A between bumps 202 of micromachine chip 102A and traces 110 of substrate 108A to become compressed and electrically conductive. Seal layer 122A is cured to mount micromachine chip 102A to substrate 108A.

The other micromachine chips 102 are mounted to the other substrates 108 by the other seal layers 122 in a similar manner and so are not discussed further to avoid detracting from the principals of the invention. Micromachine chips 102 are mounted sequentially or simultaneously. In one embodiment, after all micromachine chips 102 are mounted to array substrate 1010 as discussed above, array 1000 is baked to fully cure seal layers 122.

Since seal layers 122 are shaped as discussed above prior to mounting of micromachine chips 102, contact of micromachine areas 104 with seal layers 122 is prevented. In one embodiment, to further insure that seal layers 122 do not contact micromachine areas 104 during mounting of micromachine chips 102, vacuum is continuously applied to vents 126 thereby pulling seal layers 122 down on to upper surfaces 108U of substrates 108. However, in an alternative embodiment, micromachine chips 102 are mounted without applying vacuum to vents 126.

From mount micromachine chips to array substrate operation 814, optionally, in a mold operation 816, array 1000 is overmolded to enclose micromachine chips 102 in moldings (see molding 130 of FIG. 1 for example).

From mold operation 816, optionally, in a mark operation 818, each micromachine package 100 of array 1000 is marked, e.g., with a part number.

From mark operation 818, in a singulate array substrate operation 820, array 1000 is singulated into a plurality of individual micromachine packages 100 (FIG. 1) by singulating array substrate 1010 along singulation streets 1012. Singulation can be accomplished using any one of a number of conventional singulation techniques, e.g., by laser cutting or mechanical sawing through array substrate 1010 along singulation streets 1012. In various embodiments, array substrate 1010 is singulated before or after interconnection balls 120 (FIG. 1) are formed. Alternatively, interconnection balls 120 are not formed.

By forming a plurality of micromachine packages 100 simultaneously, less labor is used compared to handling and processing each micromachine package 100 on an individual basis. By reducing labor, the cost associated with each micromachine package 100 is minimized. However, in light of this disclosure, those of skill in the art will recognize that micromachine packages 100 can also be manufactured on an individual basis, if desired.

Although the fabrication of a plurality of micromachine packages 100 is discussed above in reference to FIGS. 8-12, micromachine packages 400, 600, 700 of FIGS. 4, 6, 7, respectively, are fabricated in a similar manner. For example, referring now to FIGS. 4 and 8 together, to fabricate micromachine packages 400, 700, substrate spacer layers 402 are formed on substrates 108 during fabricate array substrate operation 804. As a further example, referring now to FIGS. 6 and 8 together, to fabricate micromachine packages 600, 700, micromachine spacer layers 602 are formed on upper surfaces 102U before, during, between, or after operations 808, 810, and 812.

In an alternative embodiment, referring now to FIGS. 2A, 2B and 8, instead of compressing seal layers 122 during mount micromachine chips to array substrate operation 814 to form plugs 204, bumps 202 penetrate through seal layer 122 to form the electrically conductive pathways between bond pads 106 and traces 110.

In another alternative embodiment, instead of simply using heat and pressure to manipulate seal layers 122 as discussed above, ultrasonic energy is also used.

This disclosure provides exemplary embodiments of the present invention. The scope of the present invention is not limited by these exemplary embodiments. Numerous variations, whether explicitly provided for by the specification or implied by the specification or not, such as variations in structure, dimension, type of material and manufacturing process may be implemented by one of skill in the art in view of this disclosure.

What is claimed is:

1. A package comprising:
    a substrate comprising a first surface;
    a micromachine chip comprising a first surface comprising a micromachine area; and
    a seal layer forming a seal between a peripheral region of said first surface of said substrate and a peripheral region of said first surface of said micromachine chip.
2. The package of claim 1 wherein said micromachine chip further comprises bond pads on said first surface of said micromachine chip.
3. The package of claim 2 further comprising:
    traces on said first surface of said substrate; and
    columns electrically coupling said bond pads to said traces.
4. The package of claim 3 wherein said columns comprise:
    bumps; and
    plugs.
5. The package of claim 4 wherein said plugs comprise compressed regions of said seal layer.
6. The package of claim 5 wherein said seal layer is pushed away from said columns to fill any gaps between said peripheral region of said first surface of said substrate and said peripheral region of said first surface of said micromachine chip.
7. The package of claim 3 wherein said columns comprise bumps coupled to said bond pads and said traces.
8. The package of claim 7 wherein said bumps penetrate and pass through said seal layer from said bond pads to said traces.
9. The package of claim 1 wherein a surface of said seal layer and a central region of said first surface of said micromachine chip define a cavity, said micromachine area being located within said cavity.
10. The package of claim 9 wherein said substrate further comprises at least one vent extending to said seal layer directly opposite of said cavity.
11. The package of claim 10 wherein said at least one vent extends through said substrate from said first surface of said substrate to a second surface of said substrate.
12. The package of claim 1 wherein said seal layer comprises an anisotropic conductive film (ACF).
13. The package of claim 1 further comprising a substrate spacer layer on said first surface of said substrate.
14. The package of claim 1 further comprising a micromachine spacer layer on said first surface of said micromachine chip.
15. A package comprising:
    a micromachine chip comprising:
        a first surface; and
        a micromachine area comprising a micromachine element on said first surface; a substrate comprising:
        a first surface;
        a second surface; and
        at least one vent extending through said substrate from said first surface of said substrate to said second surface; and
    a seal layer between said first surface of said micromachine chip and said first surface of said substrate, wherein said at least one vent extends to a first surface of said seal layer directly opposite of a cavity defined by a second surface of said seal layer and said first surface of said micromachine chip.
16. The package of claim 15 wherein said micromachine area is located within said cavity.
17. The package of claim 15 further comprising:
    bond pads on said first surface of said micromachine chip;
    traces on said first surface of said substrate;
    columns electrically coupling said bond pads to said traces comprising:
        bumps; and
        compressed regions of said seal layer.
18. A method comprising:
    forming at least one vent in a substrate;
    applying vacuum to said at least one vent;
    pressing a seal layer on to said substrate and said at least one vent to shape said seal layer; and
    mounting a micromachine chip to said substrate with said seal layer.
19. The method of claim 18 further comprising forming bumps on bond pads of said micromachine chip using a dry process.
20. The method of claim 19 further comprising forming electrically conductive plugs by compressing regions of said seal layer with said bumps.

* * * * *